(12) United States Patent
Bhatia et al.

(10) Patent No.: US 10,090,865 B2
(45) Date of Patent: Oct. 2, 2018

(54) PERFORMANCE OPTIMIZATION IN SOFT DECODING OF ERROR CORRECTING CODES

(71) Applicant: SK Hynix Inc., Gyeonggi-do (KR)

(72) Inventors: Aman Bhatia, San Jose, CA (US); Naveen Kumar, San Jose, CA (US); Yi-Min Lin, San Jose, CA (US); Lingqi Zeng, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/432,255

(22) Filed: Feb. 14, 2017

(65) Prior Publication Data
US 2017/0279467 A1    Sep. 28, 2017

Related U.S. Application Data

(60) Provisional application No. 62/312,248, filed on Mar. 23, 2016.

(51) Int. Cl.
*H03M 13/00* (2006.01)
*H03M 13/45* (2006.01)
*H03M 13/15* (2006.01)
*H03M 13/11* (2006.01)
*H03M 13/29* (2006.01)

(52) U.S. Cl.
CPC ..... *H03M 13/458* (2013.01); *H03M 13/1102* (2013.01); *H03M 13/152* (2013.01); *H03M 13/1515* (2013.01); *H03M 13/2957* (2013.01)

(58) Field of Classification Search
CPC .......... H03M 13/458; H03M 13/1102; H03M 13/1515; H03M 13/152; H03M 13/2957
See application file for complete search history.

(56) References Cited

U.S. PATENT DOCUMENTS

| 6,966,024 | B2 * | 11/2005 | Park | H03M 13/45 714/774 |
| 7,039,846 | B2 * | 5/2006 | Hewitt | H03M 13/258 714/755 |
| 7,092,457 | B1 * | 8/2006 | Chugg | H04L 1/005 375/324 |

(Continued)

OTHER PUBLICATIONS

Thierry Goubier "Fine Grain Parallel Decoding of Turbo Product Codes: Algorithm and Architecture", Oct. 2008, 6 pages.

(Continued)

*Primary Examiner* — Esaw T Abraham
(74) *Attorney, Agent, or Firm* — Kilpatrick Townsend & Stockton LLP

(57) ABSTRACT

Techniques are described for decoding a codeword. In one example, the techniques include obtaining a first message comprising reliability information corresponding to each bit in the first codeword, determining a plurality of least reliable bits in the first codeword, and generating a plurality of flipped messages by flipping one or more of the plurality of least reliable bits in the first codeword. A number of the plurality of least reliable bits is equal to a first parameter and a number of flipped bits in each of the plurality of flipped messages is less than or equal to a second parameter. The method further includes decoding one or more of the plurality of flipped messages using a hard decoder to generate one or more candidate codewords.

20 Claims, 9 Drawing Sheets

(56) References Cited

U.S. PATENT DOCUMENTS

| | | | | |
|---|---|---|---|---|
| 7,260,762 | B2* | 8/2007 | Desai | H03M 13/2963 |
| | | | | 714/755 |
| 7,310,767 | B2* | 12/2007 | Desai | H03M 13/2909 |
| | | | | 714/780 |
| 7,373,585 | B2* | 5/2008 | Yedidia | H03M 13/1108 |
| | | | | 714/786 |
| 7,510,767 | B2 | 3/2009 | Hatsuda et al. | |
| 7,515,601 | B2* | 4/2009 | Lai | H04L 1/005 |
| | | | | 370/442 |
| 7,886,752 | B2* | 2/2011 | Jerg | A47L 15/4208 |
| | | | | 134/110 |
| 7,986,752 | B2 | 7/2011 | Nikopour-Deilami et al. | |
| 8,352,840 | B2* | 1/2013 | Crozier | H03M 13/296 |
| | | | | 714/780 |
| 8,473,780 | B2 | 6/2013 | Shalvi | |
| 8,599,959 | B2 | 12/2013 | Krachkovsky et al. | |
| 8,850,296 | B2* | 9/2014 | Weingarten | G06F 11/1068 |
| | | | | 714/781 |
| 8,850,298 | B2 | 9/2014 | Wu | |
| 8,943,384 | B2 | 1/2015 | Sridhara et al. | |
| 9,135,155 | B2* | 9/2015 | Sharon | G06F 11/1012 |
| 9,231,623 | B1 | 1/2016 | Kumar et al. | |
| 9,337,873 | B2 | 5/2016 | Marrow et al. | |
| 9,454,428 | B2* | 9/2016 | Cai | H03M 13/458 |
| 9,645,763 | B2* | 5/2017 | Sankaranarayanan | |
| | | | | G06F 3/0653 |
| 2003/0093740 | A1 | 5/2003 | Stojanovic | |
| 2015/0333776 | A1 | 11/2015 | Bolotov et al. | |
| 2016/0164543 | A1 | 6/2016 | Kumar | |
| 2017/0279465 | A1 | 9/2017 | Kumar et al. | |
| 2017/0279466 | A1 | 9/2017 | Lin et al. | |

OTHER PUBLICATIONS

Phong S. Nguyen "On Multiple Decoding Attempts for Reed-Solomon Codes: A Rate-Distortion Approach", Nov. 9, 2010, 55 pages.

Gabi Sarkis "Increasing the Speed of Polar List Decoders", Jun. 10, 2014, 6 pages.

Non-Final Office Action for U.S. Appl. No. 15/431,554, dated Dec. 27, 2017, 12 pages.

Non-Final Office Action for U.S. Appl. No. 15/433,857, dated Dec. 27, 2017, 11 pages.

Simon A. Hirst "Fast Chase Algorithm With an Application in Turbo Decoding", IEEE Transactions on Communications, vol. 49, No. 10, Oct. 2001, 7 pages.

R. Pyndiah "Near-Optimum Decoding of Product Codes: Block Turbo Codes",IEEE Transactions on Communications, vol. 46, No. 8, Aug. 1998, 8 pages.

Alexei Ashikhmin et al. "Simple MAP decoding of first-order Reed-Muller and Hamming codes," to A. Ashikhmin, S. Litsyn, published in IEEE Trans. Inform Theory, vol. 50, No. 8, pp. 1812-1818, Aug. 2004, 7 pages.

Fijo Therattil et al. "A Low-complexity Soft-decision Decoder for Extended BCH and RS-like codes," published in Conference: Information Theory, 2005. ISIT 2005. Proceedings. International Symposium, Oct. 2005, 5 pages.

Trushita Chaware et al "Performance of Turbo Product Code in Wimax," published in IJACSA Special Issue on Selected Papers from International Conference & Workshop on Advance Computing, 2013, 5 pages.

Ruiyuan Hu et al "Quantization and Quantization Sensitivity of Soft-Output Product Codes for Fast-Speed Applications," published in Advances in Wired and Wireless Communication, 2004 IEEE/ Sarnoff Symposium on Apr. 26-27, 2007, 4 pages.

* cited by examiner

PERFORMANCE OPTIMIZATION IN SOFT DECODING OF ERROR CORRECTING CODES

CROSS-REFERENCE TO RELATED APPLICATIONS

The present application claims priority to Provisional Application No. 62/312,248 entitled "Performance Optimization In Soft Decoding For Turbo Product Codes," filed Mar. 23, 2016, which is assigned to the assignee hereof and expressly incorporated by reference herein in its entirety.

TECHNICAL FIELD

The present disclosure relates generally to error correcting codes, and in particular, to an efficient soft decision decoder for decoding the error correcting codes.

BACKGROUND

For data storage applications, it is imperative to use error correcting codes (ECC) to provide data integrity. Low density parity check codes (LDPC) and Bose-Chaudhuri-Hocquenghem (BCH) codes are most commonly used for ECC in data storage applications. Use of turbo product codes (TPC) for NAND flash memories has recently been proposed. In some scenarios, turbo product codes outperform BCH and LDPC codes in hard decision decoding performance. In other scenarios, there might be a performance gap in soft decision decoding compared to LDPC codes. Turbo product codes may be decoded with a soft decision decoding algorithm, such as Chase(L) decoding for decoding row and column constituent codes, where L is the number of the least reliable bits used for flipping. The performance gain increases with larger values of L. However, complexity of Chase decoding also increases exponentially with L. There is a need in the art to improve performance of TPC codes in soft decoding with minimal increase in hardware complexity.

SUMMARY

In one example, a method for decoding a codeword is disclosed. The method includes, in part, obtaining a first message comprising reliability information corresponding to each bit in the first codeword, and determining a plurality of least reliable bits in the first codeword. The method further includes generating a plurality of flipped messages by flipping one or more of the plurality of least reliable bits in the first codeword, and decoding one or more of the plurality of flipped messages using a hard decoder to generate one or more candidate codewords. Number of the plurality of least reliable bits is equal to a first parameter. And number of flipped bits in each of the plurality of flipped messages is less than or equal to a second parameter. In one example, the first parameter is greater than or equal to the second parameter.

In one example, the method further includes selecting a decoded message from the one or more candidate codewords based on a Euclidian distance of the one or more candidate codewords from the first codeword.

In one example, the first codeword is a Bose-Chaudhuri-Hocquenghem (BCH) codeword, and the first codeword is one of the constituent codewords in a turbo product code (TPC) codeword. In one example, decoding the plurality of flipped messages comprises decoding each of the plurality of flipped messages using a hard decoder, such as a BCH decoder.

In one example, the TPC codeword includes a plurality of codewords. The method further includes adaptively changing the first and the second parameters while decoding subsequent codewords in the TPC codeword. A second codeword is decoded using a third parameter and a fourth parameter, the third parameter corresponding to a number of least reliable bits, and the fourth parameter corresponding to a maximum number of allowed flipped bits in each of the flipped messages. In one example, value of the fourth parameter is different from value of the second parameter.

In one embodiment, an apparatus for decoding a first codeword is disclosed. The apparatus includes a memory and at least one processor coupled to the memory. The at least one processor is configured to obtain a first message comprising reliability information corresponding to each bit in the first codeword, and determine a plurality of least reliable bits in the first codeword. The at least one processor is further configured to generate a plurality of flipped messages by flipping one or more of the plurality of least reliable bits in the first codeword, and decode one or more of the plurality of flipped messages using a hard decoder to generate one or more candidate codewords. Number of the plurality of least reliable bits is equal to a first parameter, and number of flipped bits in each of the plurality of flipped messages is less than or equal to a second parameter.

In one embodiment, a non-transitory processor-readable medium for decoding a first codeword is disclosed. The non-transitory processor-readable medium includes processor-readable instructions configured to cause one or more processors to obtain a first message comprising reliability information corresponding to each bit in the first codeword, and determine a plurality of least reliable bits in the first codeword. The non-transitory processor-readable medium further includes processor-readable instructions configured to cause the one or more processors to generate a plurality of flipped messages by flipping one or more of the plurality of least reliable bits in the first codeword and decode one or more of the plurality of flipped messages using a hard decoder to generate one or more candidate codewords. In one embodiment, number of the plurality of least reliable bits is equal to a first parameter, and number of flipped bits in each of the plurality of flipped messages is less than or equal to a second parameter.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
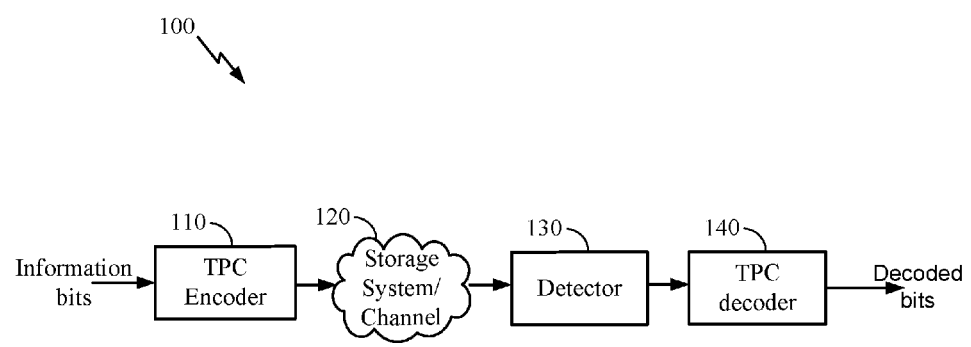
FIG. 1 illustrates an example high level block diagram of a turbo product code (TPC) error correcting system, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include turbo product codes (TPC), low density parity check codes (LDPC), Bose-Chaudhuri-Hocquenghem (BCH) codes, Reed Solomon codes, and the like.

Turbo product codes are a promising candidate for correcting errors in storage applications. Turbo product codes may include two or more dimensions, each of which corresponding to a class of error correcting codes, such as BCH codes, Reed Solomon codes, or the like. The ECC code corresponding to each dimension of the TPC code is referred to herein as a constituent code. In one example, a two-dimensional TPC codeword may include one or more error correcting codewords (e.g., BCH codewords) corresponding to its first dimension, and one or more error correcting codewords corresponding to its second dimension.

TPC codes may be decoded by performing an iterative decoding procedure on the constituent codewords in one or more dimensions. As an example, for decoding a TPC code with BCH constituent codes, the TPC decoder performs BCH decoding on one or more codewords in the first dimension and one or more codewords in the second dimension of the TPC code. The TPC decoder may iteratively continue the decoding process until either a correct codeword is found or decoding failure is declared.

The term "hard decision" is used herein to refer to a bit that comprises a "0" or a "1" value, and is associated with a particular location within a codeword. A "hard decision" may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding.

Certain embodiments disclose an efficient soft decoding procedure for decoding error correcting codes, such as BCH codes and/or TPC codes. In one embodiment, the disclosed method may be used to decode one or more of the constituent codewords in a TPC codeword. Although BCH codes are used as an example to explain the proposed method, the decoding procedure disclosed herein is not limited to decoding BCH codes and can be applied to any other class of error correcting codes. In addition, an adaptive decoder is described herein in which a first set of decoding parameters are used for a first number of decoding iterations and a second set of decoding parameters are used for a second number of decoding iterations.

FIG. 1 illustrates an example high level block diagram of a TPC error correcting system, in accordance with certain embodiments of the present disclosure. In the example shown, TPC encoder 110 receives information bits that include data which is desired to be stored in a storage system 120 or transmitted in a communications channel. TPC encoded data is output by TPC encoder 110 and is written to storage 120. In various embodiments, storage 120 may include a variety of storage types or media, such as magnetic disk drive storage, Flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to TPC decoder 140) which performs TPC decoding using the decision and/or reliability information. A soft input decoder utilizes both the decision and the reliability information to decode the codeword. A hard decoder utilizes only the decision values in the decoder to decode the codeword. After decoding, the decoded bits generated by TPC decoder are passed to the appropriate entity (e.g., the user or application which requested it). With proper encoding and decoding, the information bits match the decoded bits.

The constituent codes in each dimension of the TPC decoder may be decoded using a number of decoding algorithms, depending on the type of the code that is used in the constituent code and whether or not reliability information corresponding to each bit is available. As an example. Chase decoding algorithm may be used to decode a BCH constituent codeword. Chase decoding is a type of list decoding algorithm in which the decoder outputs a list of one or more codewords (including the correct codeword) as the final result of the decoding. For example, in Chase(L) decoding algorithm, soft information is used to identify L least reliable bits in a codeword. The identified least reliable bits are utilized to form a set of error patterns (e.g., all possible error patterns associated with the least reliable bits being in error). These possible error patterns are utilized to flip one or more bits in the received hard decision constituent codeword. A list of successful codewords may then be formed after decoding the flipped constituent codewords. A maximum likelihood metric may then be generated to select a codeword that has the minimum Euclidean distance from the received soft decision constituent codeword as the final decoded codeword. It should be noted that increasing number of the selected least reliable bits increases performance of the decoding. However, decoder complexity increases exponentially with increasing the number of selected least reliable bits.

Figure 2:
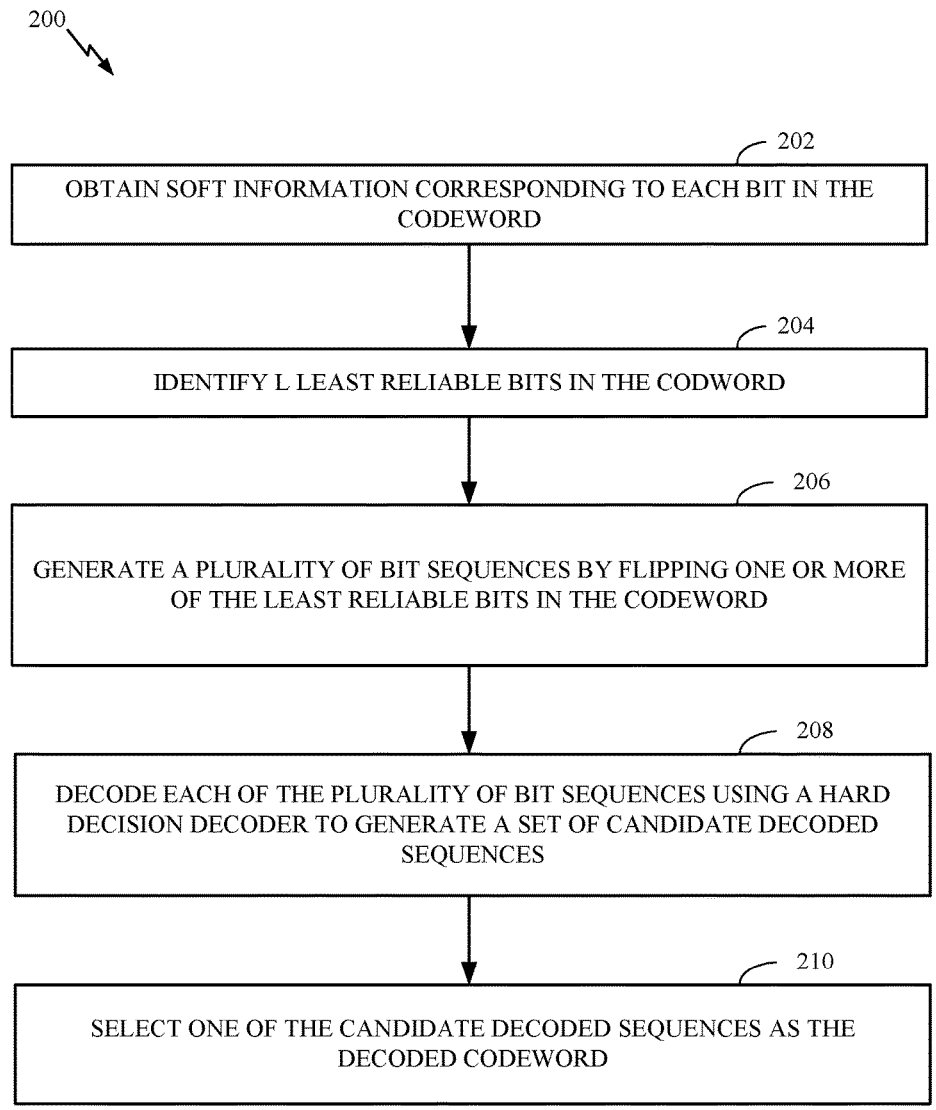
FIG. 2 illustrates a flow diagram describing an example process of decoding a codeword using Chase decoding algorithm, in accordance with certain embodiments of the present disclosure.

FIG. 2 is a flow diagram describing an example process of decoding a BCH codeword using a soft decision decoder. In this example, process 200 is implemented by a Chase(L) decoder, where L is the number of the least reliable bits used for flipping. At 202, a first codeword corresponding to a plurality of information bits and a plurality of parity bits is received. Soft information (e.g., reliabilities) corresponding to each of the bits in the codeword are obtained. At 204, the set of reliabilities are used to identify the L locations of least reliable bits (LRBs) among the received bits. The parameter L can, in general, be selected to be any integer. In one embodiment, the choice of least reliable bit locations may be refined further using the information of syndromes of other component codewords that share these bits. At 206, all possible bit flip patterns of the L least reliable bits of the input set of hard decisions (e.g., the first codeword) are generated to form $2^L$ flipped bit sequences. For example, each bit sequence is generated by flipping one or more bits in the first codeword.

At 208, each of the flipped bit sequences are decoded using a hard decision decoding algorithm (e.g., BCH hard decoder) to generate a set of candidate decoded bit sequences. The flipped set of bit sequences can be represented as $K=\{k^{(j)}, j=0, 1, \ldots, 2^L-1\}$. Each of the set of $2^L$ bit sequences is fed into a hard decision error correction decoder. The hard decision error correction decoder then attempts to decode each of the $2^L$ bit sequences. For each decoding try, there are two possibilities: if the hard decision decoder deems the input bit sequence uncorrectable, that particular decoding attempt is discarded. If the hard decision decoder deems the input bit sequence correctable, the decoder will propose one or more bit flips to the input bit sequence.

Assuming that the hard decision error correction decoder is a BCH decoder with t=3, then the decoder can propose up to t locations of the correctable input bit sequence that need to be flipped. Note that the locations of the bit flips indicated by the hard decision decoder can be anywhere in the codeword, not just in the L least reliable locations. Set $X=\{\hat{x}^{(j)}, j=0, 1, \ldots, 1,$ where $1 \leq 2^L\}$ represents the set of decoded bit sequences output by the hard decision decoder (e.g., which is in turn a part of the soft decision Chase decoder). Because not every bit sequence may be decodable, the number of decoded bit sequences l may be fewer than the total number of bit sequences, $2^L$. Furthermore, at least some of the decoded bit sequences of set X are not distinct since multiple bit sequences may be decoded to the same codeword. The decoded bit sequences of set X may be thought of as a list of "candidate codewords" or "candidate decoded bit sequences" from which one is to be selected and output by the Chase decoder.

At 210, a decoded bit sequence is selected from the set of candidate decoded bit sequences. The selected decoded bit sequence includes one or more proposed corrections corresponding to one or more of the received bits. If the decoded set X is empty, the codeword is uncorrectable. If X is not empty, one of the candidate codewords is selected from the set of candidate codewords to output from the Chase decoder as the decoded codeword. A metric is usually generated to compare different candidate decoded codewords and select one that is the most likely decoded codeword by comparing the candidate codewords to the received codeword.

Note that one or more of the L least reliable locations of the input set of hard decisions were flipped at step 206. In addition, the hard decision decoder may also flip up to t more locations of the input set of hard decisions. Thus, each of the candidate decoded codewords of set X (including the selected decoded codeword) can differ from the set of input hard decisions in up to t+L locations. The up to t+L locations in which bits differ between the input set of hard decisions and the selected decoded codeword form the set of proposed corrections by the Chase decoder.

The correction capability of a Chase decoder increases with larger values of L, but the complexity of the Chase decoder also increases exponentially with L. Thus, in some embodiments, it is preferred to have a smaller value of L. Chase decoding can increase the miscorrection problem because, by flipping up to L of the received bits, errors can, in some cases, be added. It should be noted that a BCH hard decision decoder can also introduce at most t bit-errors into the codeword through miscorrection. Therefore, Chase(L) can possibly add up to t+L errors into the codeword.

Figure 3:
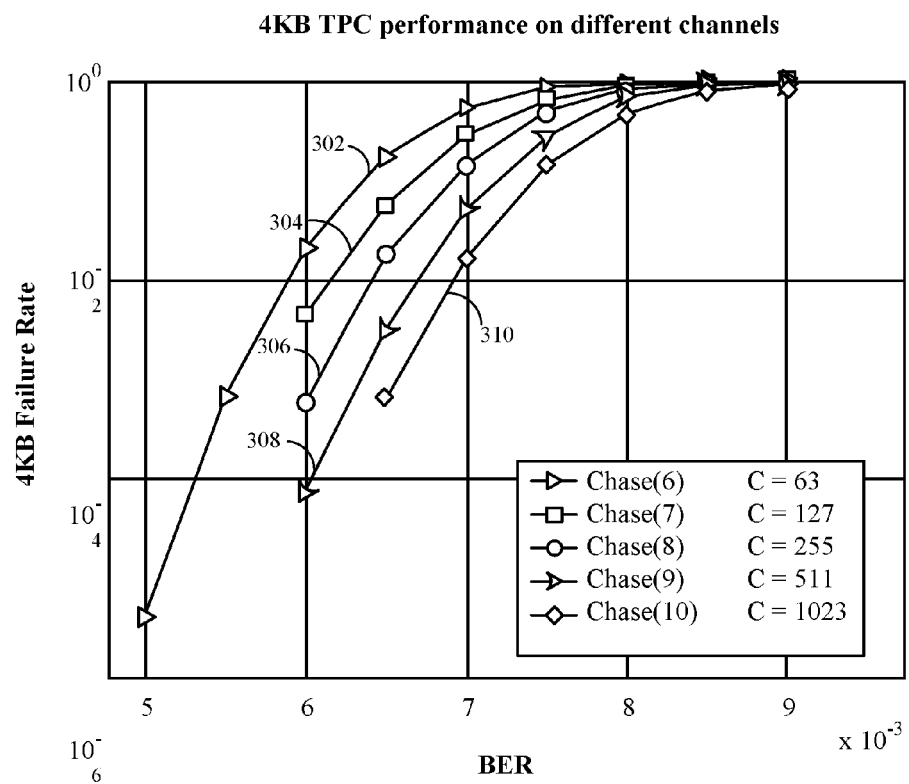
FIG. 3 illustrates performance of an example Chase decoder with increasing values of L (number of least reliable bits), according to one embodiment.

FIG. 3 illustrates performance of an example Chase decoder with different values of least reliable bits, according to one embodiment. In this figure, curve 302 illustrates block failure rate of Chase decoder when L=6. Similarly, curves 304, 306, 308 and 310 show block failure rate of Chase decoder corresponding to number of least reliable bits equal to 7, 8, 9 and 10, respectively. In addition, parameter C shows complexity of the decoding process in terms of number of BCH decoding procedures that needs to be performed for each case. As described earlier, in Chase decoding algorithm, each of the flipped patterns should be decoded using a hard decoder (e.g., a BCH decoder). Therefore, the total number of times that the hard decoder needs to be used can be written as follows:

$$C_{chase(L)} = 2^L - 1$$

In the example shown in FIG. 3, $C=2^6-1=63$ decoding procedures should be performed for Chase(6). Similarly, Chase(7) corresponds to C=127 decoding procedures, and Chase(10) corresponds to $C=2^{10}-1=1023$ decoding procedures. As can be seen, increasing the value of L improves performance of the decoder. However, complexity of the decoder is increased exponentially with increasing values of L. A diminishing performance gain may also be seen in Chase(L) decoding with increasing values of L. Therefore, increasing value of L may not be a good solution for increasing performance of Chase decoding.

Certain embodiments disclose a novel method for improving decoding performance of list decoding algorithms, such as Chase decoding with minimal additional decoding complexity. It should be noted that although the disclosed method is described with respect to the Chase decoding, in general, it can be applied to any list decoding method without departing from the teachings of the present disclosure.

In one embodiment, a modified Chase decoding procedure is disclosed which is referred to as "Chase(L,S)," in which L represents number of least reliable bits in a codeword, and S represents the maximum number of allowable bit-flips out of L possible error locations. In general, the L possible error locations correspond to the locations of the L least reliable bits. In the Chase(L,S) decoding, as proposed herein, the total number of BCH decoding procedures can be given as follows:

$$C_{chase(L,S)} = \sum_{k=0}^{S} \binom{L}{k}$$

As can be seen, number of times that the BCH decoder is used in the proposed method is much smaller than the number of times that the BCH decoder is used in the conventional Chase decoder.

It should be noted that Chase decoding can provide the correct codeword as long as the number of erroneous bits do not exceed the correction capability of the hard decision BCH decoder by more than S (e.g., the number of erroneous bits is equal to or smaller than (t+S), and, the number of erroneous bits that do not appear in the L least reliable bits is equal to or smaller than t. As an example, the BCH decoder (which is part of the Chase soft decoder) may correct t errors and the soft decision Chase decoder may correct additional S errors (a total of t+S errors may be corrected by the Chase soft decoder.)

In one example, consider a decoding system with t=5, L=15, and S=4.

Case i) Total number of errors e is greater than or equal to ten (e>=10). In this case since e>t+S, Chase decoding will fail.

Case ii) The total number of errors is smaller than or equal to five (e<=5). In this case, since e<=t, Chase decoding will succeed regardless of how many erroneous bits do not appear in the LRBs.

Case iii) The total number of errors is equal to eight (e=8), the number of erroneous bits in LRBs is equal to two, and the number of erroneous bits not in LRBs is equal to 6. In this case, e<=t+S. However, the number of errors that are not in LRBs (e.g., 6) is greater than t, therefore, the Chase decoder will fail.

Case iv) The total number of errors is equal to eight (e=8), the number of erroneous bits in LRB is equal to three, and the number of erroneous bits not in LRBs is equal to 5. In this case, e<=t+S as well as the number of errors that are not in LRBs is equal to t. Therefore, Chase decoding will succeed.

Case v) The total number of errors is equal to nine (e=9). The number of erroneous bits in LRB is equal to 6, and the number of erroneous bits not in LRBs is equal to 3. In this case, even though 6 errors are in LRBs, only 4 errors will be flipped during Chase pattern generation step and the remaining errors will be corrected by the hard-decoder step. Thus, Chase decoding will succeed.

In one embodiment, the proposed Chase(L,S) decoding algorithm limits the maximum allowable flips out of the L possible error locations to be equal to S. It should be noted that value of S may depend on parameters of the system and desired decoding performance of the soft decoder. For example, the value of S can be determined by considering the desired latency of the decoder. Increasing the value of S results in a better decoding performance at the cost of extra decoding latency. Also, increasing value of S gives diminishing returns after a certain point. Therefore, in one example, S can be selected heuristically using simulations. Any other method may also be used to determine the value of S without departing from the teachings of the present disclosure.

Figure 4:
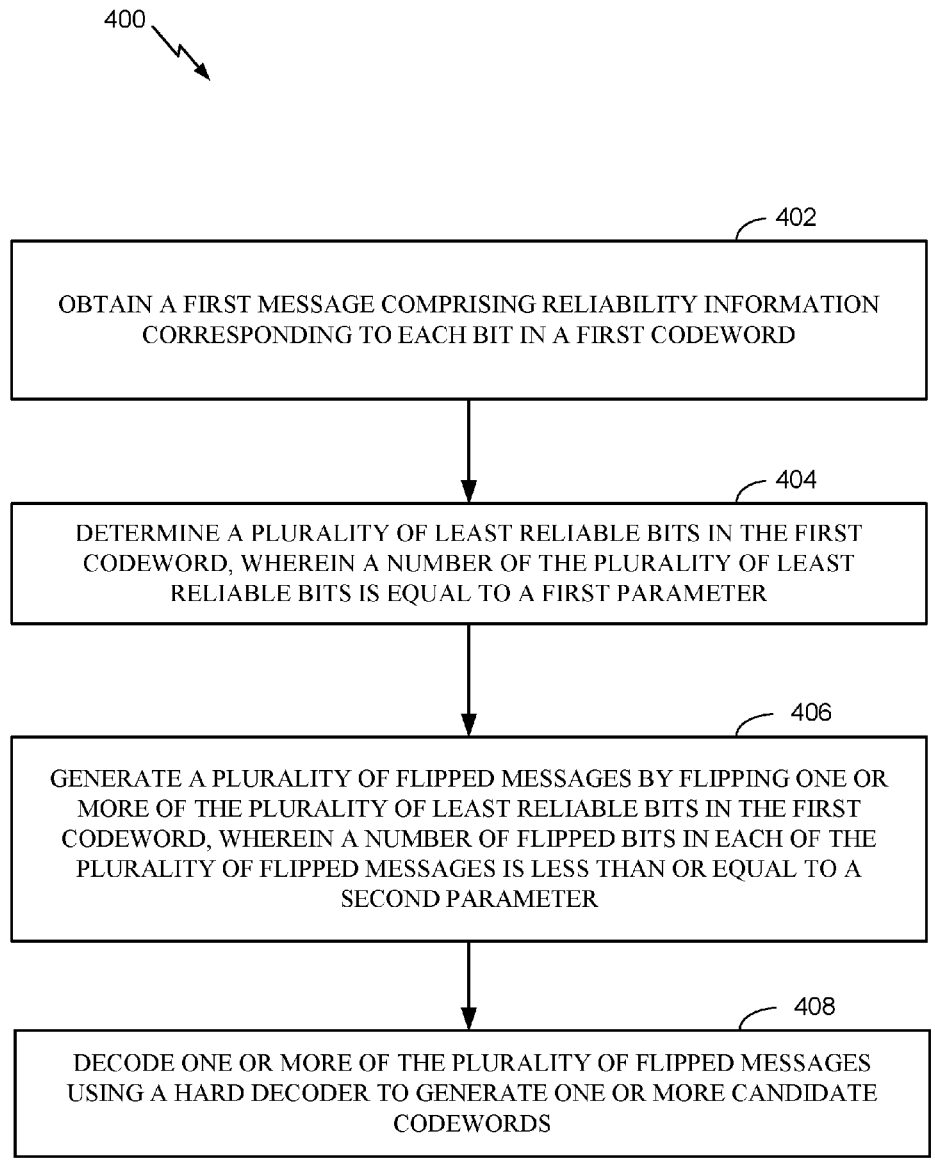
FIG. 4 illustrates example operations that may be performed by a device to decode a codeword, in accordance with certain embodiments of the present disclosure.

FIG. 4 illustrates example operations that may be performed by a device to decode a codeword, in accordance with certain embodiments of the present disclosure. At 402, the device obtains a first message comprising reliability information corresponding to each bit in the first codeword. At 404, the device determines a plurality of least reliable bits in the first codeword, wherein a number of the plurality of least reliable bits is equal to a first parameter (e.g., L in Chase(L,S)). At 406, the device generates a plurality of flipped messages by flipping one or more of the plurality of least reliable bits in the first codeword. In one embodiment, number of flipped bits in each of the plurality of flipped messages is less than or equal to a second parameter. At 408, the device decodes one or more of the plurality of flipped messages using a hard decoder to generate one or more candidate codewords. In one embodiment, the device selects a decoded message from the one or more candidate codewords based on a Euclidian distance of the one or more candidate codewords from the first codeword.

Figure 5:
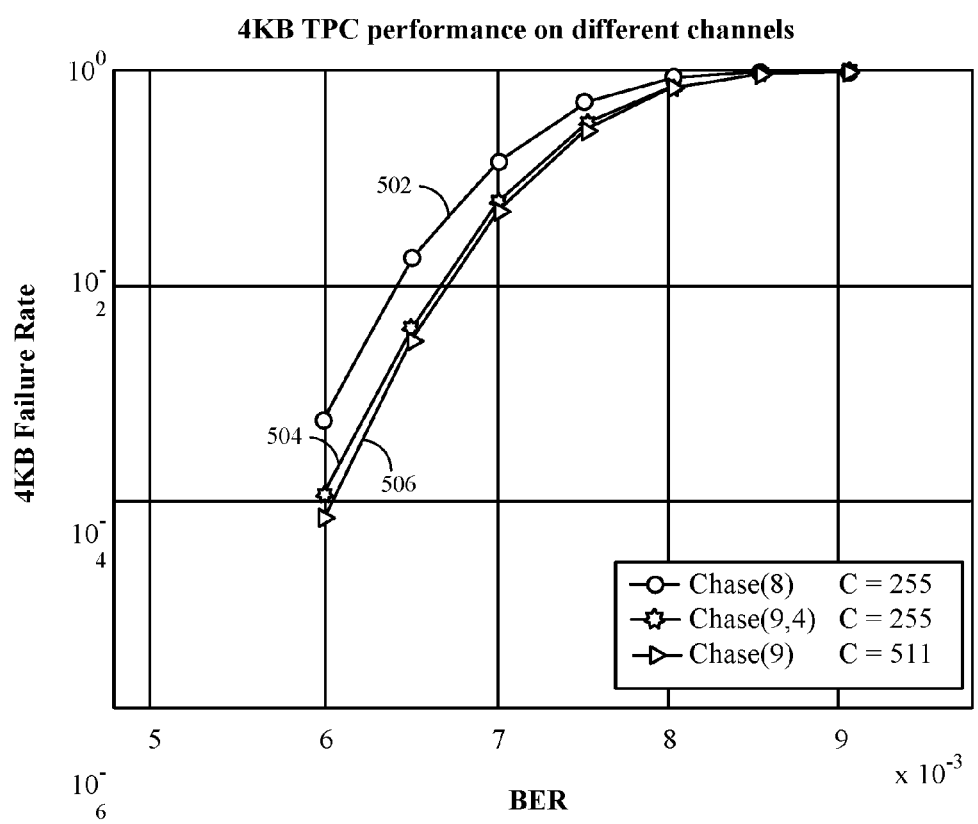
FIG. 5 illustrates example performance of the proposed Chase (L,S) decoding method, in accordance with certain embodiments of the present disclosure.

FIG. 5 illustrates an example performance curve of the proposed Chase (L,S) decoding method, in accordance with certain embodiments of the present disclosure. Curves 502 and 506 illustrate example performances of a conventional Chase(L) decoding with L=8, and L=9, respectively. In addition, curve 504 illustrates performance of a modified Chase decoder (e.g., Chase(L,S)) as disclosed herein. In the example shown in curve 504, L=9 and S=4. As can be seen, the modified Chase(9,4) algorithm has similar performance as in Chase(9) algorithm. However, complexity of the Chase (9,4) algorithm is much lower than complexity of Chase(9)

algorithm. As described earlier, Chase(9) decodes $511=2^9-1$ flipped bit sequences. Similarly, the Chase(8) decoding algorithm decodes $255=2^8-1$ flipped bit sequences to find the decoded codeword. On the other hand, the proposed Chase (9,4) decoding method decodes 255 flipped bit sequences with much better decoding performance compared to the Chase(8) decoding algorithm. As shown in FIG. 5, in this example, decoding performance of Chase(9,4) is close to decoding performance of Chase(9), however, the decoding complexity of Chase(9,4) is similar to Chase(8).

Figure 6:
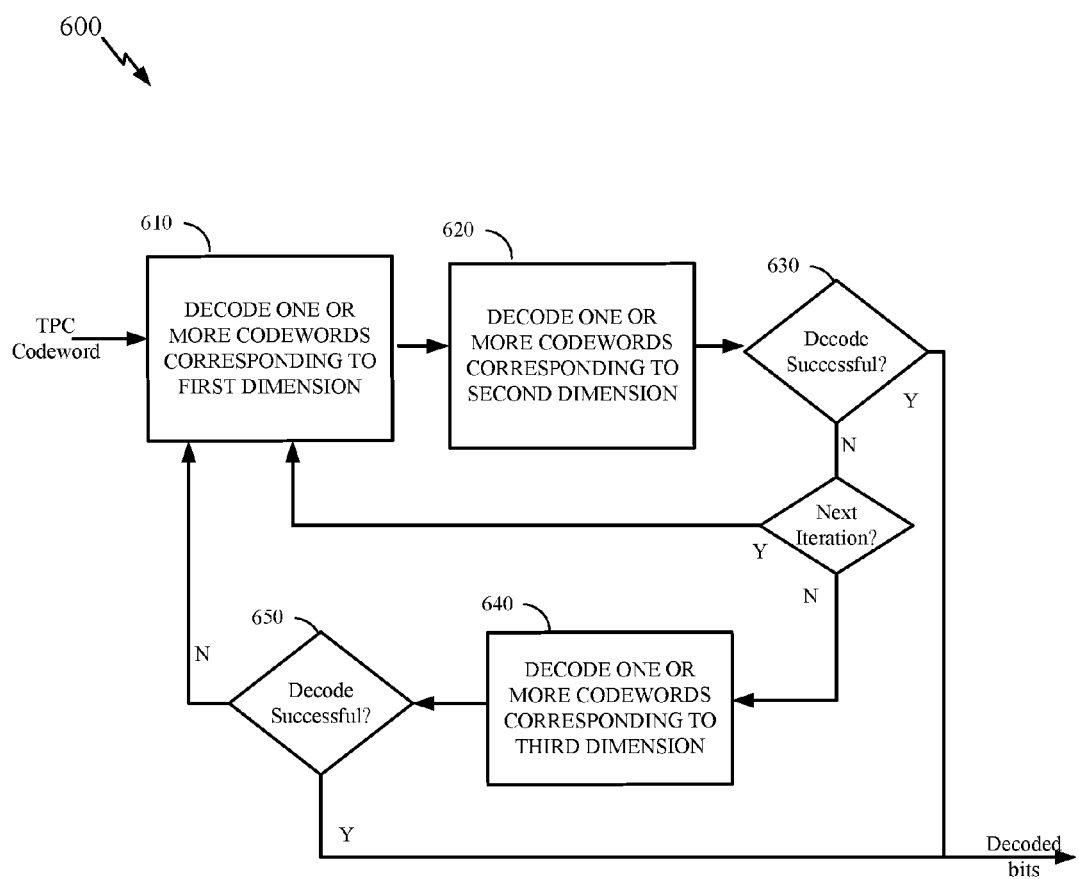
FIG. 6 illustrates an example three-dimensional TPC decoder, in accordance with certain embodiments of the present disclosure.
Figure 8:
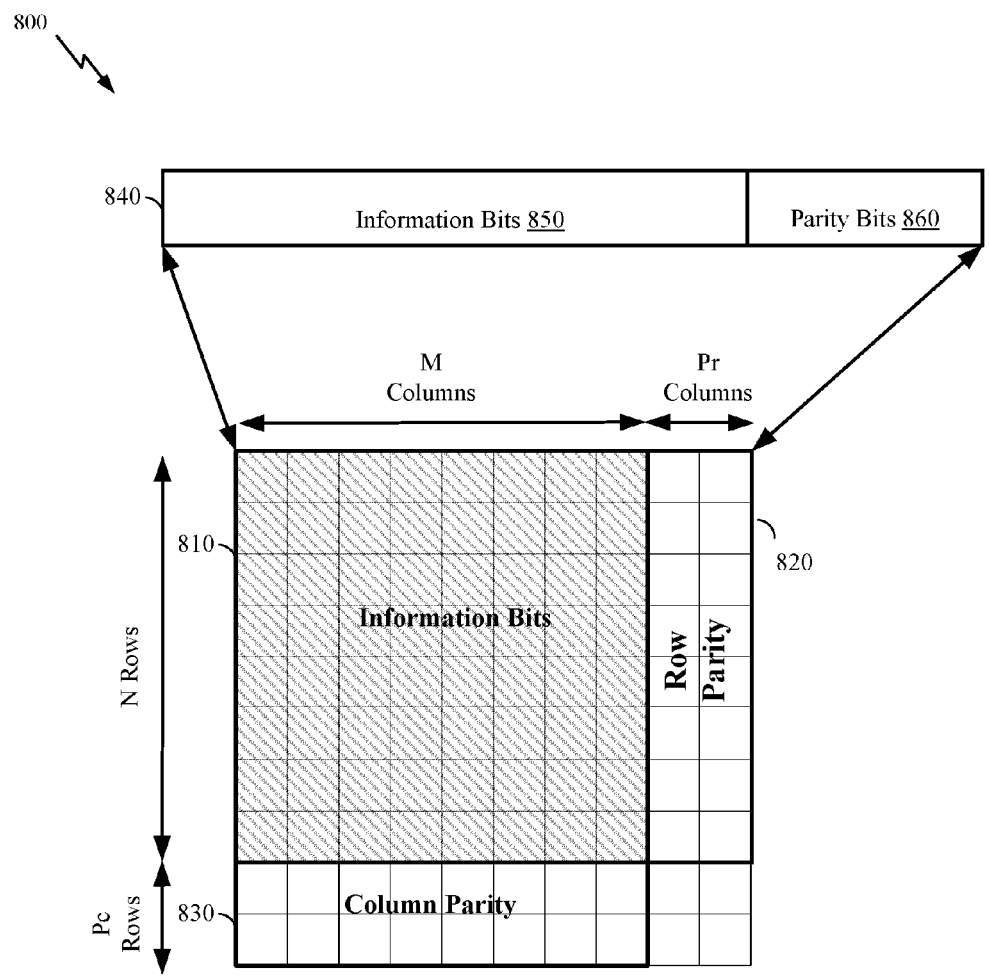
FIG. 8 illustrates an example block diagram of a TPC codeword, in accordance with certain embodiments of the present disclosure.

FIG. 6 illustrates an example multi-dimensional TPC decoder 600, in accordance with certain embodiments of the present disclosure. In general, a TPC decoder may perform soft and/or hard decoding on one or more of the row constituent codes and/or column constituent codes iteratively to generate a correct TPC codeword. At 610, the TPC decoder decodes one or more codewords corresponding to a first dimension constituent code (e.g., a row codeword) in a received TPC codeword. As an example, for the TPC codeword as illustrated in FIG. 8, the decoder may decode one or more of the N row codewords. In one example, if each of the row constituent codewords is a BCH codeword, the TPC decoder performs BCH decoding (e.g., Chase (L,S) soft decoding, hard decoding, etc.) on each of the row codewords.

At 620, the decoder may decode one or more codewords corresponding to the second dimension constituent code. For example, the decoder may decode one or more of the M column codewords. In one example, if each of the column codewords is a BCH codeword, the TPC decoder performs BCH decoding on each of the column codewords. At 630, the decoder checks if decoding has been successful or not. If yes, the decoding stops and the decoder outputs the decoded bits. If the TPC decoding has not been successful (e.g., the decoder did not converge to a correct codeword), the TPC decoder may iteratively perform decoding on the first dimension and/or second dimension codewords to correct errors. Alternatively at 640, the TPC decoder may decode one or more codewords corresponding to the third dimension. At 650, the TPC decoder checks if the decoding has been successful or not. If yes, the decoded bits are output from the decoder. If the decoding process has not been successful, the TPC decoder may perform another round of decoding on the first, second and third dimensions of the decoder to find a correct codeword. If the decoder reaches a maximum number of iterations, the decoding process may stop even if a correct codeword is not found. The TPC decoder in FIG. 6 has three dimensions. However, the TPC decoder, in general, may include any number of dimensions without departing from the teachings of the present disclosure.

Certain embodiments disclose an adaptive decoding method for improving the performance of soft decoding. In one embodiment, in the proposed adaptive decoding method, decoding parameters of the decoder are modified and/or adjusted after a certain number of iterations are performed. For example, in a TPC code with BCH constituent codes, a first set of decoding iterations may be performed using Chase ($L_1,S_1$) and a second set of decoding iterations may be performed using Chase ($L_2,S_2$). Each of the first set and the second set may have one or more iterations. As an example, the first five decoding iterations may be performed using Chase (6, 4) and another four decoding iterations may be performed using Chase (8,5). In another embodiment, a first set of decoding iterations may be performed using a regular Chase(L) decoding algorithm and a second set of decoding iterations may be performed using the modified Chase(L,S) algorithm. Any other combination of the decoding algorithms may be used without departing from the teachings of the present disclosure.

In one embodiment, decoding parameters of the adaptive decoder (e.g., $L_1$, $S_1$, $L_2$, $S_2$) may be determined based on the expected channel and/or expected amount of noise at different iterations. In general, $L_1$, $L_2$, $S_1$ and $S_2$ parameters can be found through simulation based on the parameters of the system and the channel and/or any other method. In one example, for the first few iterations of the TPC decoding, a code with higher correction capability may be used to be able to identify and correct as many errors as possible. After a few iterations, the decoding parameters may be modified to a second set of decoding parameters for the remainder of iterations. In this example, decoding parameters of the adaptive decoder is adjusted only once. However, in general, decoding parameters of the adaptive decoder may be adjusted any number of times during the decoding process without departing from the teachings of the present disclosure.

Figure 7:
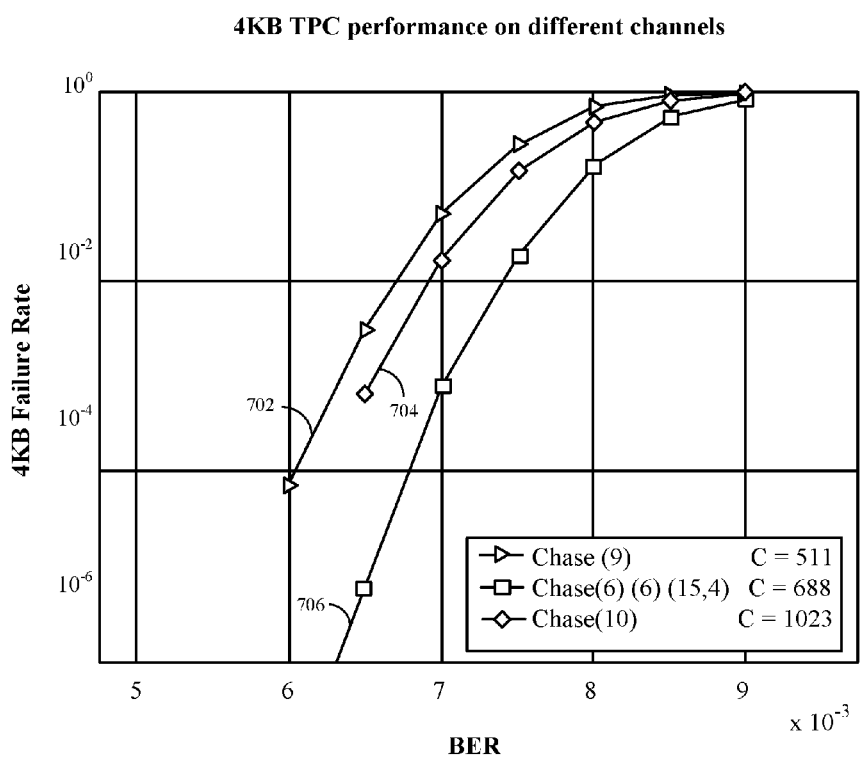
FIG. 7 illustrates performance of an example adaptive TPC decoder, in accordance with certain embodiments of the present disclosure.

FIG. 7 illustrates performance of an example adaptive TPC decoder, in accordance with certain embodiments of the present disclosure. In this figure, decoding parameters are selected for an additive white Gaussian channel (AWGN). However, the proposed ideas can be applied to any other channels. Curves 702 and 704 show performances of an original Chase(9) and an original Chase(10) decoder. In each of these two cases, decoding parameters are kept constant for different iterations. In curve 706, decoding performance is shown where Chase(6) is used at first two iterations of the adaptive decoding and Chase(15,4) is used at third iteration of the adaptive decoding. The decoding is performed iteratively until the codeword is successfully decoded or the maximum allowable number of iterations is reached. In the example shown in FIG. 7, the simulation results are shown with 10-15 iterations. In one example, Chase(L, S) parameters are cycled as follows—(6), (6), (15,4), (6), (6), (15,4), (6), (6), (15,4), etc. As can be seen, complexity of the proposed adaptive decoding procedure (e.g., curve 706) is smaller than a regular Chase(10) but the performance gain is significant. In this example, the adaptive decoder breaks error patterns in which a few errors are present in the first 15 least reliable locations such that those errors are not present in the first ten least reliable locations.

FIG. 8 illustrates an example block diagram of a two-dimensional TPC codeword 800, in accordance with certain embodiments of the present disclosure. As illustrated, the TPC codeword 800 may be a matrix of size $(N+P_c) \times (M+P_r)$, in which N represents number of rows of information bits, M represents number of columns of information bits, $P_r$ represents number of row parity bits, and $P_c$ represents number of column parity bits. Information bits can be represented by a matrix of size N×M (e.g., matrix 810), row parity bits can be represented by a matrix of size N×$P_r$ (e.g., matrix 820), and column parity bits may be represented by a matrix of size $P_c$×M (e.g., matrix 830). The TPC codeword may include N codewords corresponding to its first dimension (e.g., row codewords), and M codewords corresponding to its second dimension (e.g., column codeword). Each row codeword 840 includes multiple information bits 850 and one or more parity bits 860. Similarly, each column codeword includes multiple information bits and one or more parity bits. As an example, if BCH codes are used as row constituent codes, the row codewords 1 through N are constructed using BCH encoding. Similarly, column codewords 1 through M are generated using an error correcting constituent code (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

Figure 9:
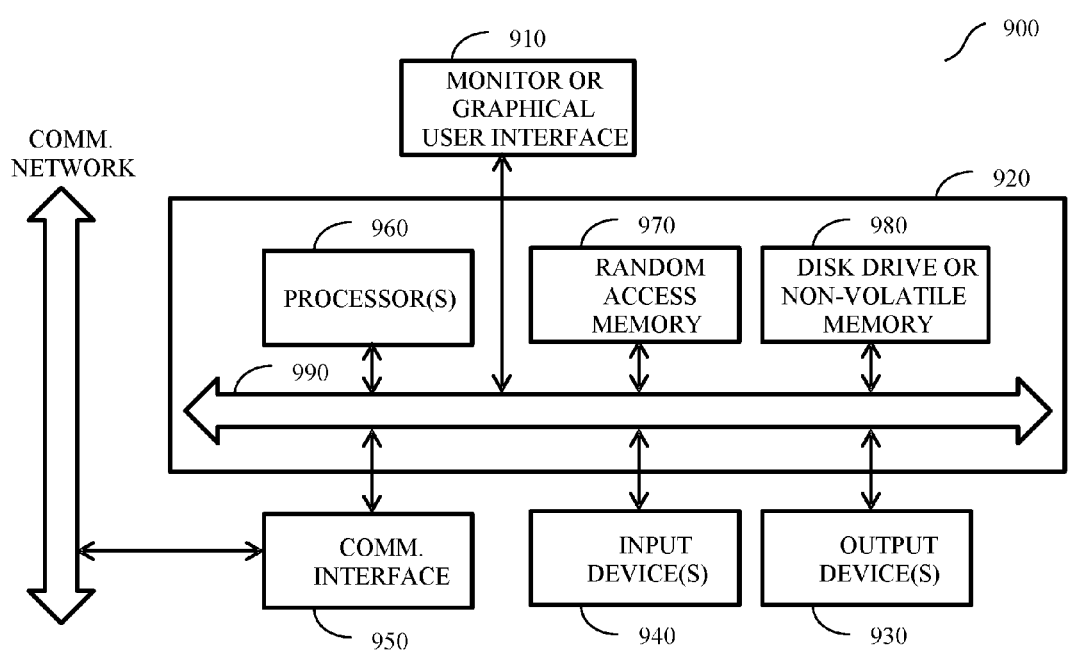
FIG. 9 describes one potential implementation of a device which may be used to decode a TPC codeword, according to one embodiment.

FIG. 9 describes one potential implementation of a device which may be used to decode a codeword, according to certain embodiments. FIG. 9 is merely illustrative of an embodiment incorporating the present invention and does not limit the scope of the invention as recited in the claims. One of ordinary skill in the art would recognize other variations, modifications, and alternatives. In one embodiment, computer system 900 typically includes a monitor 910, a computer 920, user output devices 930, user input devices 940, communications interface 950, and the like.

As shown in FIG. 9, computer 920 may include a processor(s) 960 that communicates with a number of peripheral devices via a bus subsystem 990. These peripheral devices may include user output devices 930, user input devices 940, communications interface 950, and a storage subsystem, such as random access memory (RAM) 970 and disk drive 980.

User input devices 930 include all possible types of devices and mechanisms for inputting information to computer system 920. These may include a keyboard, a keypad, a touch screen incorporated into the display, audio input devices such as voice recognition systems, microphones, and other types of input devices. In various embodiments, user input devices 930 are typically embodied as a computer mouse, a trackball, a track pad, a joystick, wireless remote, drawing tablet, voice command system, eye tracking system, and the like. User input devices 930 typically allow a user to select objects, icons, text and the like that appear on the monitor 910 via a command such as a click of a button or the like.

User output devices 940 include all possible types of devices and mechanisms for outputting information from computer 920. These may include a display (e.g., monitor 910), non-visual displays such as audio output devices, etc.

Communications interface 950 provides an interface to other communication networks and devices. Communications interface 950 may serve as an interface for receiving data from and transmitting data to other systems. Embodiments of communications interface 950 typically include an Ethernet card, a modem (telephone, satellite, cable, ISDN), (asynchronous) digital subscriber line (DSL) unit, FireWire interface, USB interface, and the like. For example, communications interface 950 may be coupled to a computer network, to a FireWire bus, or the like. In other embodiments, communications interfaces 950 may be physically integrated on the motherboard of computer 920, and may be a software program, such as soft DSL, or the like.

In various embodiments, computer system 900 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 920 includes one or more Xeon microprocessors from Intel as processor(s) 960. Further, one embodiment, computer 920 includes a UNIX-based operating system.

RAM 970 and disk drive 980 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 970 and disk drive 980 may be configured to store the basic programming and data constructs that provide the functionality of the present invention.

Software code modules and instructions that provide the functionality of the present invention may be stored in RAM 970 and disk drive 980. These software modules may be executed by processor(s) 960. RAM 970 and disk drive 980 may also provide a repository for storing data used in accordance with the present invention.

RAM 970 and disk drive 980 may include a number of memories including a main random access memory (RAM) for storage of instructions and data during program execution and a read only memory (ROM) in which fixed non-transitory instructions are stored. RAM 970 and disk drive 980 may include a file storage subsystem providing persistent (non-volatile) storage for program and data files. RAM 970 and disk drive 980 may also include removable storage systems, such as removable flash memory.

Bus subsystem 990 provides a mechanism for letting the various components and subsystems of computer 920 communicate with each other as intended. Although bus subsystem 990 is shown schematically as a single bus, alternative embodiments of the bus subsystem may utilize multiple busses.

FIG. 9 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for decoding a first codeword, comprising:
    obtaining a first message comprising reliability information corresponding to each bit in the first codeword, wherein the first codeword comprises a first constituent codeword of a turbo product code (TPC) codeword;
    determining a plurality of least reliable bits in the first codeword based on the reliability information, wherein a number of the plurality of least reliable bits is equal to a first parameter "L" of a Chase decoder, wherein the first parameter "L" represents "L" possible error locations in the first codeword;
    generating, based on the Chase decoder, a plurality of flipped messages by flipping one or more of the plurality of least reliable bits in the first, wherein a number of flipped bits in each of the plurality of flipped messages is limited to a second parameter "S" of the Chase decoder, wherein the second parameter "S" is smaller than the first parameter "L" and represents a maximum number of allowable bit-flips out of the "L" possible error locations; and
    decoding one or more of the plurality of flipped messages using at least the Chase decoder to generate one or more candidate codewords.

2. The method of claim 1, further comprising:
    selecting a decoded message from the one or more candidate codewords based on a Euclidian distance of the one or more candidate codewords from the first codeword.

3. The method of claim 1, wherein the second parameter is based on a latency simulation of the Chase decoder.

4. The method of claim 1, wherein decoding the plurality of flipped messages comprises decoding each of the plurality of flipped messages using the Chase decoder.

5. The method of claim 1, wherein the first codeword is a Bose-Chaudhuri-Hocquenghem (BCH) codeword.

6. The method of claim 5, wherein the TPC codeword comprises a plurality of constituent codewords, the method further comprising:
    decoding the first constituent codeword of the TPC codeword in a set of decoding iterations by using the first parameter "L" and the second parameter "S;" and
    decoding a second constituent codeword of the TPC codeword in a subsequent set of decoding iterations by at least increasing the first parameter "L" to a third parameter "L" and increasing the second parameter "S" to a fourth parameter "S".

7. The method of claim 6, wherein a value of the fourth parameter is different from a value of the second parameter.

8. An apparatus for decoding a first codeword, comprising:
    a memory;
    at least one processor coupled to the memory, the at least one processor configured to:
        obtain a first message comprising reliability information corresponding to each bit in the first codeword, wherein the first codeword comprises a first constituent codeword of a turbo product code (TPC) codeword;
        determine a plurality of least reliable bits in the first codeword codeword based on the reliability information, wherein a number of the plurality of least reliable bits is equal to a first parameter "L" of a Chase decoder, wherein the first parameter "L" represents "L" possible error locations in the first codeword;
        generate, based on the Chase decoder, a plurality of flipped messages by flipping one or more of the plurality of least reliable bits in the first codeword, wherein a number of flipped bits in each of the plurality of flipped messages limited to a second parameter "S" of the Chase decoder, wherein the second parameter "S" is smaller than the first parameter "L" and represents a maximum number of allowable bit-flips out of the "L" possible error locations; and
        decode one or more of the plurality of flipped messages using at least the Chase decoder to generate one or more candidate codewords.

9. The apparatus of claim 8, wherein the at least one processor is further configured to:
    select a decoded message from the one or more candidate codewords based on a Euclidian distance of the one or more candidate codewords from the first codeword.

10. The apparatus of claim 8, wherein the second parameter is based on a latency simulation of the Chase decoder.

11. The apparatus of claim 8, wherein the at least one processor is further configured to decode each of the plurality of flipped messages using the Chase decoder.

12. The apparatus of claim 8, wherein the first codeword is a Bose-Chaudhuri-Hocquenghem (BCH) codeword.

13. The apparatus of claim 12, wherein the TPC codeword comprises a plurality of constituent codewords, wherein the at least one processor is further configured to:
    decode the first constituent codeword of the TPC codeword in a set of decoding iterations by using the first parameter "L" and the second parameter "S;" and decode a second constituent codeword of the TPC codeword in a subsequent set of decoding iterations by at least increasing the first parameter "L" to a third parameter "L" and increasing the second parameter "S" to a fourth parameter "S".

14. The apparatus of claim 13, wherein a value of the fourth parameter is different from a value of the second parameter.

15. A non-transitory processor-readable medium for decoding a first codeword, comprising processor-readable instructions configured to cause one or more processors to:
   obtain a first message comprising reliability information corresponding to each bit in the first codeword, wherein the first codeword comprises a first constituent codeword of a turbo product code (TPC) codeword;
   determine a plurality of least reliable bits in the first codeword based on the reliability information, wherein a number of the plurality of least reliable bits is equal to a first parameter "L" of a Chase decoder, wherein the first parameter "L" represents "L" possible error locations in the first codeword;
   generate, based on the Chase decoder, a plurality of flipped messages by flipping one or more of the plurality of least reliable bits in the first codeword, wherein a number of flipped bits in each of the plurality of flipped messages is limited to a second parameter "S" of the Chase decoder, wherein the second parameter "S" is smaller than the first parameter "L" and represents a maximum number of allowable bit-flips out of the "L" possible error locations; and
   decode one or more of the plurality of flipped messages using at least the Chase decoder to generate one or more candidate codewords.

16. The processor-readable medium of claim 15, wherein the processor-readable instructions are further configured to cause one or more processors to:
   select a decoded message from the one or more candidate codewords based on a Euclidian distance of the one or more candidate codewords from the first codeword.

17. The processor-readable medium of claim 15, wherein the second parameter is based on a latency simulation of the Chase decoder.

18. The processor-readable medium of claim 15, wherein the processor-readable instructions are further configured to cause one or more processors to decode each of the plurality of flipped messages using the Chase decoder.

19. The processor-readable medium of claim 15, wherein the first codeword is a Bose-Chaudhuri-Hocquenghem (BCH) codeword.

20. The processor-readable medium of claim 19, wherein the TPC codeword comprises a plurality of constituent codewords, wherein the processor-readable instructions are further configured to cause one or more processors to:
   decode the first constituent codeword of the TPC codeword in a set of decoding iterations by using the first parameter "L" and the second parameter "S;" and
   decode a second constituent codeword of the TPC codeword in a subsequent set of decoding iterations by at least increasing the first parameter "L" to a third parameter "L" and increasing the second parameter "S" to a fourth parameter "S".

* * * * *